(12) United States Patent
Reitinger

(10) Patent No.: US 7,900,373 B2
(45) Date of Patent: Mar. 8, 2011

(54) METHOD FOR CONDITIONING SEMICONDUCTOR WAFERS AND/OR HYBRIDS

(75) Inventor: Erich Reitinger, Munich (DE)

(73) Assignee: ERS Electronic GmbH, Germering (DE)

( * ) Notice: Subject to any disclaimer, the term of this patent is extended or adjusted under 35 U.S.C. 154(b) by 946 days.

(21) Appl. No.: 10/511,335

(22) PCT Filed: Apr. 15, 2003

(86) PCT No.: PCT/EP03/03937
§ 371 (c)(1),
(2), (4) Date: May 5, 2005

(87) PCT Pub. No.: WO03/088323
PCT Pub. Date: Oct. 23, 2003

(65) Prior Publication Data
US 2005/0227503 A1   Oct. 13, 2005

(30) Foreign Application Priority Data

Apr. 15, 2002   (DE) ................................. 102 16 786

(51) Int. Cl.
*F26B 11/06* (2006.01)
(52) U.S. Cl. ................. 34/381; 34/413; 34/497; 34/492; 34/495; 118/712; 324/760
(58) Field of Classification Search ................. 34/77, 78, 34/80, 380, 381, 413, 495, 497, 492; 118/712; 324/760
See application file for complete search history.

(56) References Cited

U.S. PATENT DOCUMENTS

| | | | | |
|---|---|---|---|---|
| 3,269,136 A | * | 8/1966 | Umano | 62/123 |
| 3,473,022 A | * | 10/1969 | Koch et al. | 422/82.09 |
| 4,015,340 A | * | 4/1977 | Treleven | 34/278 |
| 4,079,522 A | * | 3/1978 | Ham | 34/247 |
| 4,258,731 A | * | 3/1981 | Tsujimoto et al. | 132/212 |
| 4,434,563 A | * | 3/1984 | Graalmann et al. | 34/364 |
| 4,520,252 A | * | 5/1985 | Inoue | 219/69.17 |
| 4,531,307 A | * | 7/1985 | Kuecker | 34/552 |
| 4,538,899 A | * | 9/1985 | Landa et al. | 399/156 |
| 4,612,978 A | * | 9/1986 | Cutchaw | 165/104.33 |
| 4,628,616 A | * | 12/1986 | Shirai et al. | 34/78 |
| 4,628,991 A | * | 12/1986 | Hsiao et al. | 165/80.4 |
| 4,693,211 A | * | 9/1987 | Ogami et al. | 118/725 |

(Continued)

FOREIGN PATENT DOCUMENTS
EP   511928 A1 * 11/1992

(Continued)

OTHER PUBLICATIONS

First Examiner's Report dated Feb. 23, 2009 in corresponding Canadian Appln. No. 2,481,260.

*Primary Examiner* — Stephen M. Gravini

(57) ABSTRACT

The present invention provides a method for conditioning semiconductor wafers and/or hybrids having the steps: preparation of a space (1) which is at least partially enclosed and has a wafer/hybrid holding device (10) which is located therein and has the purpose of holding a semiconductor wafer and/or hybrid; and conduction of a dry fluid through the wafer/hybrid holding device (10) in order to heat-treat the wafer/hybrid holding device (10); wherein at least a portion of the fluid leaving the wafer/hybrid holding device (10) is used to condition the atmosphere within the space (1). The invention also provides a corresponding device for conditioning semiconductor wafers and/or hybrids.

9 Claims, 5 Drawing Sheets

U.S. PATENT DOCUMENTS

| | | | |
|---|---|---|---|
| 4,724,621 A * | 2/1988 | Hobson et al. | 34/218 |
| 4,776,105 A * | 10/1988 | Mishina et al. | 34/78 |
| 4,817,299 A * | 4/1989 | Pabst | 34/636 |
| 4,841,645 A * | 6/1989 | Bettcher et al. | 34/78 |
| 4,872,835 A * | 10/1989 | Tullis et al. | 432/225 |
| 4,974,062 A * | 11/1990 | Maier et al. | 257/414 |
| 5,038,496 A * | 8/1991 | Mishina et al. | 34/78 |
| 5,088,006 A * | 2/1992 | del Puerto et al. | 361/699 |
| 5,115,858 A * | 5/1992 | Fitch et al. | 165/80.4 |
| 5,155,652 A * | 10/1992 | Logan et al. | 361/234 |
| 5,186,238 A * | 2/1993 | del Puerto et al. | 165/80.4 |
| 5,191,506 A * | 3/1993 | Logan et al. | 361/234 |
| 5,192,849 A * | 3/1993 | Moslehi | 219/121.43 |
| 5,203,401 A * | 4/1993 | Hamburgen et al. | 165/80.4 |
| 5,209,028 A * | 5/1993 | McDermott et al. | 451/89 |
| 5,277,030 A * | 1/1994 | Miller | 62/3.2 |
| 5,285,798 A * | 2/1994 | Banerjee et al. | 131/194 |
| 5,310,453 A * | 5/1994 | Fukasawa et al. | 438/716 |
| 5,357,984 A * | 10/1994 | Farrier et al. | 131/369 |
| 5,369,891 A * | 12/1994 | Kamikawa | 34/78 |
| 5,504,040 A * | 4/1996 | Moslehi | 438/761 |
| 5,517,828 A * | 5/1996 | Calton et al. | 62/271 |
| 5,521,790 A * | 5/1996 | Ruckel et al. | 361/234 |
| 5,525,780 A * | 6/1996 | Moslehi | 219/618 |
| 5,526,578 A * | 6/1996 | Iyer | 34/97 |
| 5,540,245 A * | 7/1996 | Munakata et al. | 134/76 |
| 5,551,245 A * | 9/1996 | Calton et al. | 62/90 |
| 5,564,281 A * | 10/1996 | Calton et al. | 62/90 |
| 5,569,330 A * | 10/1996 | Schild et al. | 134/1 |
| 5,575,079 A * | 11/1996 | Yokomizo et al. | 34/78 |
| 5,582,721 A * | 12/1996 | Mita et al. | 210/181 |
| 5,595,241 A * | 1/1997 | Jelinek | 165/80.1 |
| 5,635,070 A * | 6/1997 | Allington et al. | 210/634 |
| 5,644,467 A * | 7/1997 | Steger et al. | 361/234 |
| 5,649,428 A * | 7/1997 | Calton et al. | 62/94 |
| 5,657,553 A * | 8/1997 | Tarui et al. | 34/78 |
| 5,671,544 A * | 9/1997 | Yokomizo et al. | 34/78 |
| 5,695,795 A * | 12/1997 | Murray et al. | 426/11 |
| 5,698,070 A * | 12/1997 | Hirano et al. | 438/729 |
| 5,709,037 A * | 1/1998 | Tanaka et al. | 34/330 |
| 5,715,132 A * | 2/1998 | Steger et al. | 361/234 |
| 5,715,612 A * | 2/1998 | Schwenkler | 34/470 |
| 5,720,818 A * | 2/1998 | Donde et al. | 118/500 |
| 5,738,498 A * | 4/1998 | Allington et al. | 417/53 |
| 5,755,559 A * | 5/1998 | Allington et al. | 417/53 |
| 5,775,416 A * | 7/1998 | Heimanson et al. | 165/275 |
| 5,815,942 A * | 10/1998 | Wu et al. | 34/78 |
| 5,826,128 A * | 10/1998 | Nishida | 396/572 |
| 5,835,334 A * | 11/1998 | McMillin et al. | 361/234 |
| 5,843,512 A * | 12/1998 | Daouse et al. | 426/512 |
| 5,862,605 A * | 1/1999 | Horie et al. | 34/68 |
| 5,864,966 A * | 2/1999 | Singletery | 34/517 |
| 5,869,114 A * | 2/1999 | Murray et al. | 426/11 |
| 5,885,353 A * | 3/1999 | Strodtbeck et al. | 118/712 |
| 5,901,030 A * | 5/1999 | Logan et al. | 361/234 |
| 5,904,776 A * | 5/1999 | Donde et al. | 118/500 |
| 5,931,721 A * | 8/1999 | Rose et al. | 451/89 |
| 5,940,985 A * | 8/1999 | Kamikawa et al. | 34/471 |
| 5,950,328 A * | 9/1999 | Ichiko et al. | 34/364 |
| 5,950,723 A * | 9/1999 | Heimanson et al. | 165/275 |
| 5,956,859 A * | 9/1999 | Matsumoto et al. | 34/74 |
| 5,967,156 A * | 10/1999 | Rose et al. | 134/7 |
| 5,989,462 A * | 11/1999 | Buazza et al. | 264/1.36 |
| 5,994,662 A * | 11/1999 | Murugesh | 219/121.43 |
| 5,996,242 A * | 12/1999 | Matsumoto et al. | 34/76 |
| 6,022,418 A * | 2/2000 | Iwabuchi | 118/728 |
| 6,026,589 A * | 2/2000 | Yao et al. | 34/78 |
| 6,032,382 A * | 3/2000 | Matsumoto et al. | 34/78 |
| 6,045,624 A * | 4/2000 | Kamikawa et al. | 134/30 |
| 6,050,275 A * | 4/2000 | Kamikawa et al. | 134/105 |
| 6,059,567 A * | 5/2000 | Bolton et al. | 432/81 |
| 6,067,727 A * | 5/2000 | Muraoka | 34/317 |
| 6,071,408 A * | 6/2000 | Allington et al. | 210/634 |
| 6,077,357 A * | 6/2000 | Rossman et al. | 118/728 |
| 6,080,272 A * | 6/2000 | Langley et al. | 156/345.53 |
| 6,083,344 A * | 7/2000 | Hanawa et al. | 156/345.28 |
| 6,098,408 A * | 8/2000 | Levinson et al. | 62/3.2 |
| 6,099,643 A * | 8/2000 | Ohtani et al. | 118/52 |
| 6,108,932 A * | 8/2000 | Chai | 34/245 |
| 6,109,206 A * | 8/2000 | Maydan et al. | 118/723 IR |
| RE36,897 E * | 10/2000 | Murray et al. | 426/11 |
| 6,128,830 A * | 10/2000 | Bettcher et al. | 34/404 |
| 6,131,588 A * | 10/2000 | Kamikawa et al. | 134/102.3 |
| 6,134,807 A * | 10/2000 | Komino et al. | 34/418 |
| 6,158,449 A * | 12/2000 | Kamikawa | 134/61 |
| 6,170,268 B1 * | 1/2001 | Elfert et al. | 62/63 |
| 6,170,496 B1 * | 1/2001 | Chen et al. | 134/102.1 |
| 6,174,155 B1 * | 1/2001 | Buazza et al. | 425/143 |
| 6,174,157 B1 * | 1/2001 | Daouse et al. | 425/218 |
| 6,182,602 B1 * | 2/2001 | Redeker et al. | 118/723 R |
| 6,189,483 B1 * | 2/2001 | Ishikawa et al. | 118/723 E |
| 6,192,600 B1 * | 2/2001 | Bergman | 34/267 |
| 6,194,571 B1 * | 2/2001 | Lukasavage | 540/475 |
| 6,199,564 B1 * | 3/2001 | Yokomizo | 134/78 |
| 6,201,117 B1 * | 3/2001 | Lukasavage | 540/474 |
| 6,203,406 B1 * | 3/2001 | Rose et al. | 451/39 |
| 6,210,541 B1 * | 4/2001 | Cooney et al. | 204/192.15 |
| 6,212,789 B1 * | 4/2001 | Kato et al. | 34/77 |
| 6,214,988 B1 * | 4/2001 | Lukasavage et al. | 540/475 |
| 6,216,364 B1 * | 4/2001 | Tanaka et al. | 34/448 |
| 6,230,499 B1 * | 5/2001 | Hohne | 62/6 |
| 6,244,282 B1 * | 6/2001 | Weber | 134/135 |
| 6,254,809 B1 * | 7/2001 | Parent et al. | 264/1.33 |
| 6,265,573 B1 * | 7/2001 | Lukasavage | 540/474 |
| 6,286,451 B1 * | 9/2001 | Ishikawa et al. | 118/723 I |
| 6,290,274 B1 * | 9/2001 | Montoya | 294/64.1 |
| 6,319,329 B1 * | 11/2001 | Kamikawa et al. | 134/2 |
| 6,319,410 B1 * | 11/2001 | Allington et al. | 210/634 |
| 6,327,994 B1 * | 12/2001 | Labrador | 114/382 |
| 6,334,266 B1 * | 1/2002 | Moritz et al. | 34/337 |
| 6,342,104 B1 * | 1/2002 | Kamikawa et al. | 134/26 |
| 6,354,311 B1 * | 3/2002 | Kimura et al. | 134/61 |
| 6,367,928 B1 * | 4/2002 | Buazza et al. | 351/159 |
| 6,368,523 B1 * | 4/2002 | Buazza et al. | 264/1.36 |
| 6,373,679 B1 * | 4/2002 | Qiao et al. | 361/230 |
| 6,374,512 B1 * | 4/2002 | Guo et al. | 34/362 |
| 6,375,758 B1 * | 4/2002 | Nakashima et al. | 134/30 |
| 6,377,437 B1 * | 4/2002 | Sexton et al. | 361/234 |
| 6,398,875 B1 * | 6/2002 | Cotte et al. | 134/2 |
| 6,401,732 B2 * | 6/2002 | Bergman | 134/61 |
| 6,413,355 B1 * | 7/2002 | Kamikawa et al. | 156/345.11 |
| 6,418,728 B1 * | 7/2002 | Monroe | 62/3.2 |
| 6,425,953 B1 * | 7/2002 | Johnson | 134/1 |
| 6,428,724 B1 * | 8/2002 | Lukasavage et al. | 264/3.4 |
| 6,430,841 B1 * | 8/2002 | Borkowski et al. | 34/557 |
| 6,436,739 B1 * | 8/2002 | Wickboldt et al. | 438/149 |
| 6,446,355 B1 * | 9/2002 | Jones et al. | 34/245 |
| 6,460,721 B2 * | 10/2002 | Bowen et al. | 220/586 |
| 6,461,801 B1 * | 10/2002 | Wang | 430/329 |
| 6,473,993 B1 * | 11/2002 | Yagi et al. | 34/380 |
| 6,491,045 B2 * | 12/2002 | Kamikawa et al. | 134/102.3 |
| 6,511,616 B1 * | 1/2003 | Parent et al. | 264/1.33 |
| 6,549,026 B1 * | 4/2003 | DiBattista et al. | 324/760 |
| 6,552,560 B2 * | 4/2003 | Melgaard et al. | 324/760 |
| 6,562,146 B1 * | 5/2003 | DeYoung et al. | 134/30 |
| 6,564,469 B2 * | 5/2003 | Jahanbani et al. | 34/76 |
| 6,567,258 B2 * | 5/2003 | Sexton et al. | 361/234 |
| 6,596,093 B2 * | 7/2003 | DeYoung et al. | 134/36 |
| 6,598,312 B2 * | 7/2003 | Kim et al. | 34/72 |
| 6,602,351 B2 * | 8/2003 | DeYoung et al. | 134/36 |
| 6,605,955 B1 * | 8/2003 | Costello et al. | 324/760 |
| 6,613,157 B2 * | 9/2003 | DeYoung et al. | 134/36 |
| 6,615,510 B2 * | 9/2003 | Jones et al. | 34/448 |
| 6,628,503 B2 * | 9/2003 | Sogard | 361/324 |
| 6,634,177 B2 * | 10/2003 | Lin et al. | 62/3.2 |
| 6,641,678 B2 * | 11/2003 | DeYoung et al. | 134/36 |
| 6,646,233 B2 * | 11/2003 | Kanno et al. | 219/390 |
| 6,649,883 B2 * | 11/2003 | Iwamoto et al. | 219/494 |
| 6,684,652 B2 * | 2/2004 | Kim et al. | 62/185 |
| 6,700,099 B2 * | 3/2004 | Cole et al. | 219/444.1 |
| 6,736,668 B1 * | 5/2004 | Cheng et al. | 439/487 |
| 6,740,853 B1 * | 5/2004 | Johnson et al. | 219/444.1 |
| 6,746,543 B2 * | 6/2004 | Kamikawa et al. | 134/26 |
| 6,771,086 B2 * | 8/2004 | Lutz et al. | 324/760 |
| 6,796,054 B2 * | 9/2004 | Minami et al. | 34/443 |
| 6,808,567 B2 * | 10/2004 | Takeshita et al. | 118/715 |
| 6,838,390 B2 * | 1/2005 | Langley et al. | 438/715 |

| Patent Number | Date | Inventor | Class |
|---|---|---|---|
| 6,853,953 B2 * | 2/2005 | Brcka et al. | 702/182 |
| 6,895,179 B2 * | 5/2005 | Kanno et al. | 392/416 |
| 6,897,940 B2 * | 5/2005 | Sogard | 355/55 |
| 6,904,702 B2 * | 6/2005 | Sotojima et al. | 34/467 |
| 6,905,984 B2 * | 6/2005 | Kellerman et al. | 438/597 |
| 6,939,899 B2 * | 9/2005 | Buazza et al. | 523/106 |
| 6,966,949 B2 * | 11/2005 | Kobayashi et al. | 118/663 |
| 6,969,830 B2 * | 11/2005 | Cole et al. | 219/444.1 |
| 6,986,214 B2 * | 1/2006 | Minami et al. | 34/443 |
| 7,002,341 B2 * | 2/2006 | Baudenbacher et al. | 324/248 |
| 7,024,798 B2 * | 4/2006 | Minami et al. | 34/443 |
| 7,046,025 B2 * | 5/2006 | Schneidewind et al. | 324/760 |
| 7,072,165 B2 * | 7/2006 | Kellerman et al. | 361/234 |
| 7,111,467 B2 * | 9/2006 | Apparao et al. | 62/79 |
| 7,138,606 B2 * | 11/2006 | Kanno et al. | 219/390 |
| 7,156,951 B1 * | 1/2007 | Gao et al. | 156/345.53 |
| 7,195,693 B2 * | 3/2007 | Cowans | 156/345.51 |
| 7,215,697 B2 * | 5/2007 | Hill | 372/76 |
| 7,225,819 B2 * | 6/2007 | Jackson | 134/200 |
| 7,271,604 B2 * | 9/2007 | Reitinger | 324/760 |
| 7,276,485 B1 * | 10/2007 | Cerreta et al. | 514/23 |
| 7,314,506 B2 * | 1/2008 | Vininski et al. | 95/114 |
| 7,329,389 B2 * | 2/2008 | Horovitz et al. | 422/83 |
| 7,347,006 B2 * | 3/2008 | Moriya et al. | 34/403 |
| 7,393,757 B2 * | 7/2008 | Miyamoto et al. | 438/460 |
| 7,425,838 B2 * | 9/2008 | Itakura et al. | 324/754 |
| 7,442,275 B2 * | 10/2008 | Cowans | 156/345.52 |
| 7,447,025 B2 * | 11/2008 | Chen et al. | 361/696 |
| 7,479,463 B2 * | 1/2009 | Kulp et al. | 438/781 |
| 7,489,718 B2 * | 2/2009 | Hill | 372/76 |
| 7,517,498 B2 * | 4/2009 | Fredrick | 422/101 |
| 7,520,068 B2 * | 4/2009 | Yi et al. | 34/218 |
| 7,547,358 B1 * | 6/2009 | Shapiro | 117/68 |
| 7,615,970 B1 * | 11/2009 | Gimlan | 320/166 |
| 2001/0025431 A1 * | 10/2001 | Kitano et al. | 34/406 |
| 2002/0000198 A1 * | 1/2002 | Ishikawa et al. | 118/715 |
| 2002/0053573 A1 * | 5/2002 | Bowen et al. | 220/581 |
| 2002/0066726 A1 * | 6/2002 | Cole et al. | 219/444.1 |
| 2002/0075625 A1 * | 6/2002 | Sexton et al. | 361/234 |
| 2002/0130276 A1 * | 9/2002 | Sogard | 250/492.2 |
| 2002/0135389 A1 * | 9/2002 | Melgaard et al. | 324/760 |
| 2002/0142593 A1 * | 10/2002 | Langley et al. | 438/689 |
| 2002/0166256 A1 * | 11/2002 | Samoilov et al. | 34/406 |
| 2002/0174667 A1 * | 11/2002 | Kim et al. | 62/185 |
| 2003/0015294 A1 * | 1/2003 | Wang | 156/345.52 |
| 2003/0033116 A1 * | 2/2003 | Brcka et al. | 702/182 |
| 2003/0039299 A1 * | 2/2003 | Horovitz et al. | 374/141 |
| 2003/0154723 A1 * | 8/2003 | Lin et al. | 62/3.2 |
| 2003/0155939 A1 * | 8/2003 | Lutz et al. | 324/760 |
| 2003/0168439 A1 * | 9/2003 | Kanno et al. | 219/390 |
| 2003/0172542 A1 * | 9/2003 | Minami et al. | 34/92 |
| 2003/0183960 A1 * | 10/2003 | Buazza et al. | 264/1.38 |
| 2003/0213793 A1 * | 11/2003 | Cole et al. | 219/444.1 |
| 2003/0228772 A1 * | 12/2003 | Cowans | 438/795 |
| 2004/0013956 A1 * | 1/2004 | Sogard | 430/30 |
| 2004/0022028 A1 * | 2/2004 | Hildebrandt | 361/700 |
| 2004/0025790 A1 * | 2/2004 | Ben | 118/724 |
| 2004/0045184 A1 * | 3/2004 | Takeshita et al. | 34/218 |
| 2004/0045813 A1 * | 3/2004 | Kanno et al. | 204/242 |
| 2004/0055540 A1 * | 3/2004 | Kanno et al. | 118/724 |
| 2004/0070415 A1 * | 4/2004 | Schneidewind et al. | 324/760 |
| 2004/0076411 A1 * | 4/2004 | Kanno et al. | 392/416 |
| 2004/0123484 A1 * | 7/2004 | Yoshikawa et al. | 34/410 |
| 2004/0129015 A1 * | 7/2004 | Apparao et al. | 62/335 |
| 2004/0145366 A1 * | 7/2004 | Baudenbacher et al. | 324/248 |
| 2004/0216325 A1 * | 11/2004 | Minami et al. | 34/549 |
| 2005/0016467 A1 * | 1/2005 | Hsiao et al. | 118/728 |
| 2005/0018376 A1 * | 1/2005 | Park et al. | 361/234 |
| 2005/0032332 A1 * | 2/2005 | Miyamoto et al. | 438/460 |
| 2005/0041364 A1 * | 2/2005 | Kellerman et al. | 361/234 |
| 2005/0042768 A1 * | 2/2005 | Fredrick | 436/174 |
| 2005/0048781 A1 * | 3/2005 | Langley et al. | 438/689 |
| 2005/0069011 A1 * | 3/2005 | Hill | 372/76 |
| 2005/0079737 A1 * | 4/2005 | Kellerman et al. | 438/964 |
| 2005/0123665 A1 * | 6/2005 | Cerreta et al. | 426/531 |
| 2005/0160619 A1 * | 7/2005 | Minami et al. | 34/406 |
| 2005/0183283 A1 * | 8/2005 | Evanyk et al. | 34/96 |
| 2005/0217583 A1 * | 10/2005 | Cole et al. | 118/724 |
| 2006/0005420 A1 * | 1/2006 | Deguchi et al. | 34/304 |
| 2006/0023395 A1 * | 2/2006 | Hsiao et al. | 361/234 |
| 2006/0086247 A1 * | 4/2006 | Vininski et al. | 95/115 |
| 2006/0137822 A1 * | 6/2006 | Cowans | 156/345.51 |
| 2006/0158427 A1 * | 7/2006 | Reitinger | 324/760 |
| 2006/0242967 A1 * | 11/2006 | Lin et al. | 62/3.3 |
| 2006/0252000 A1 * | 11/2006 | Hayashi et al. | 432/253 |
| 2006/0274474 A1 * | 12/2006 | Lee et al. | 361/143 |
| 2006/0275547 A1 * | 12/2006 | Lee et al. | 427/248.1 |
| 2007/0024299 A1 * | 2/2007 | Itakura et al. | 324/754 |
| 2007/0084496 A1 * | 4/2007 | Edey | 136/201 |
| 2007/0089834 A1 * | 4/2007 | Brillhart et al. | 156/345.27 |
| 2007/0091538 A1 * | 4/2007 | Buchberger et al. | 361/234 |
| 2007/0091539 A1 * | 4/2007 | Buchberger et al. | 361/234 |
| 2007/0091540 A1 * | 4/2007 | Brillhart et al. | 361/234 |
| 2007/0091541 A1 * | 4/2007 | Buchberger et al. | 361/234 |
| 2007/0097637 A1 * | 5/2007 | Chen et al. | 361/696 |
| 2007/0135880 A1 * | 6/2007 | Eggers et al. | 607/113 |
| 2007/0169373 A1 * | 7/2007 | Aoki et al. | 34/549 |
| 2007/0206652 A1 * | 9/2007 | Hill | 372/76 |
| 2007/0214631 A1 * | 9/2007 | Landrigan | 29/527.1 |
| 2007/0220775 A1 * | 9/2007 | Miya | 34/351 |
| 2008/0006207 A1 * | 1/2008 | Miyagawa et al. | 118/724 |
| 2008/0052947 A1 * | 3/2008 | Miya | 34/317 |
| 2008/0083700 A1 * | 4/2008 | Bernard et al. | 216/55 |
| 2008/0101434 A1 * | 5/2008 | Horovitz et al. | 374/29 |
| 2008/0127508 A1 * | 6/2008 | Ohno et al. | 34/552 |
| 2008/0200039 A1 * | 8/2008 | Li et al. | 438/776 |
| 2008/0277885 A1 * | 11/2008 | Duff et al. | 279/3 |
| 2009/0081449 A1 * | 3/2009 | Ohwaki et al. | 428/334 |
| 2009/0085444 A1 * | 4/2009 | Alvarez Icaza Rivera et al. | 310/365 |
| 2009/0119981 A1 * | 5/2009 | Drozd et al. | 44/544 |
| 2009/0149930 A1 * | 6/2009 | Schenck | 607/100 |
| 2009/0179365 A1 * | 7/2009 | Lerner et al. | 269/21 |
| 2009/0188211 A1 * | 7/2009 | Galliher et al. | 53/434 |
| 2009/0205363 A1 * | 8/2009 | de Strulle | 62/533 |
| 2009/0216910 A1 * | 8/2009 | Duchesneau | 709/250 |
| 2009/0255457 A1 * | 10/2009 | Shapiro | 117/79 |
| 2009/0270954 A1 * | 10/2009 | Schenck | 607/102 |
| 2009/0272028 A1 * | 11/2009 | Drozd et al. | 44/569 |
| 2009/0305397 A1 * | 12/2009 | Dodgson et al. | 435/305.3 |
| 2010/0005763 A1 * | 1/2010 | Bloom | 55/315.1 |
| 2010/0101771 A1 * | 4/2010 | Roy et al. | 165/247 |

FOREIGN PATENT DOCUMENTS

| | | |
|---|---|---|
| EP | 641017 A1 * | 3/1995 |
| EP | 675525 A1 * | 10/1995 |
| EP | 0732557 | 9/1996 |
| JP | 57198296 A * | 12/1982 |
| JP | 62042725 A * | 2/1987 |
| JP | 62101688 A * | 5/1987 |
| JP | 63010522 A * | 1/1988 |
| JP | 01053420 A * | 3/1989 |
| JP | 01213662 A * | 8/1989 |
| JP | 01231329 A * | 9/1989 |
| JP | 03234021 | 10/1991 |
| JP | 03267095 A * | 11/1991 |
| JP | 04168716 A * | 6/1992 |
| JP | 05154292 A * | 6/1993 |
| JP | 06045310 | 2/1994 |
| JP | 07263526 A * | 10/1995 |
| JP | 08266798 A * | 10/1996 |
| JP | 10026492 A * | 1/1998 |
| JP | 2000310459 A * | 11/2000 |
| JP | 2002299319 A * | 10/2002 |
| JP | 2003090892 A * | 3/2003 |
| JP | 2007027218 A * | 2/2007 |
| JP | 2007235171 A * | 9/2007 |
| JP | 2009091648 A * | 4/2009 |
| JP | 2010129766 A * | 6/2010 |
| WO | WO 9719303 A1 * | 5/1997 |
| WO | 9910927 | 3/1999 |
| WO | WO 0103794 A1 * | 1/2001 |
| WO | WO 0125706 | 4/2001 |

* cited by examiner

METHOD FOR CONDITIONING SEMICONDUCTOR WAFERS AND/OR HYBRIDS

The present invention relates to a method and a device for conditioning semiconductor wafers and/or hybrids.

It is known to carry out test measurements on semiconductor wafers typically in a temperature range between −200° C. and +400° C. For the heat treatment a semiconductor wafer is applied to a sample stage which is cooled and/or heated according to the desired temperature. In the process it is necessary to ensure that the temperature of the semiconductor wafer does not drop below the dew point of the surrounding gaseous medium since otherwise moisture condenses on the surface of the wafer or icing occurs, which impedes or prevents the test measurements.

FIG. 5 shows a schematic cross-sectional view of a conditioning device for the purpose of explaining the problems on which the present invention is based.

In FIG. 4, reference symbol 1 designates a space in a container 5 in which a sample stage 10 which can be temperature controlled is provided and on which a semiconductor wafer (not shown) can be positioned for test purposes. The volume of the container 5 is usually between 400 and 800 litres.

The space 1 is enclosed essentially by the walls of the container 5 which have bushings for electrical lines and media supply lines as well as, if appropriate, bushings for probes which are to be attached externally and with which the test measurements semiconductor wafer shown are to be carried out. However, this space 1 must not be hermetically sealed by the container 5 depending on the application but must at least be enclosed to such an extent that undesired penetration of moist ambient air can be prevented by building up an internal excess pressure.

The sample stage 10 (also referred to as chuck) has a thermal insulation 15 via which it is connected to a usually movable base 20. A corresponding movement mechanism (not shown) is generally adjustable in the X, Y and Z directions. If the movement mechanism is not located in the container, a seal has to be provided between the base and container.

Furthermore, a heating device 90, which can be supplied from the outside with electrical current for heating purposes and which has a temperature probe (not shown), is integrated into the sample stage 10.

Reference symbol 100 designates a dew point sensor by means of which the dew point within the container 5 can be determined and which can supply a corresponding signal to a monitor 101 outside the container 5. The dew point sensor 100 is used in particular for the sake of reliability when opening the device so that, for example, compensatory heating can be carried out in order to avoid condensation of water.

Furthermore, outflow elements 30 (oBdA. only two are shown) via which dried air from outside, or a similar fluid such as, for example, nitrogen, can be introduced via a line r1 into the container in order to drive out moist ambient air from the container 5. This air is firstly fed externally to an air drier 3 via a line r00 and then fed into the line r1.

A separate unit, which is connected to the container 5 via a corresponding electrical line 11 and a media supply line r2, is the temperature control rack 2 which has the following devices.

Reference symbol 80 designates a temperature controller which can regulate the temperature of the sample stage 10 by heating by means of the heating device 90, the sample stage 10 simultaneously or alternatively being rinsed with air for cooling purposes, as is explained in more detail below.

Reference symbol 70 designates a temperature regulating device to which dried air is fed via the lines r0 and i1 from, for example, a gas bottle or from an air drier, and which has a heat exchanger 95 which is connected to cooling assemblies 71, 72 by means of which it can be cooled to a predetermined temperature.

The dried air which is fed via the lines r0, i1 is conducted through the heat exchanger 95 and then fed via the supply line r2 into the container 5 to the sample stage 10, through which it crosses in corresponding cooling coils or cooling pipes (not shown). The dried air which has cooled the sample stage 10 leaves it via the line r3 and is conducted out of the container 5 to the atmosphere.

The dried air, which is conducted into the container 5 via the outflow elements 30 in order to condition the atmosphere of the container 5 is usually kept at room temperature so that only the surface of the sample stage 10 is kept at the desired measuring temperature, for example −20° C., but the other elements in the container 5 are approximately at room temperature. This dried air which is fed via the outflow elements 30 flows out of the container 5 through slits or gaps (not shown) or a separate outlet line.

The fact that a relatively high consumption of dried air occurs because said air, on the one hand for conditioning the atmosphere and on the other hand for cooling the sample stage 10, is blown through the container 5 and into the atmosphere, proves disadvantageous in this known device for conditioning semiconductor wafers. As a result, the consumption of dried air is relatively high. A failure of the air drier 3 also brings about immediate icing of the test wafer at corresponding temperatures.

For this reason, the object of the present invention is to specify a method and a device for conditioning semiconductor wafers and/or hybrids, which permit more efficient conditioning.

The method according to the invention having the features of claim 1 and the corresponding device according to claim 9 have, in comparison with the known solution approach, the advantage that the dried gas, for example the dried air, can be used efficiently. Further advantages are the high level of operational reliability and the fact that freedom from ice and condensation is ensured because the dry air leaving the wafer/hybrid holding device is always below the dew point of the temperature at the wafer/hybrid holding device.

The idea on which the present invention is based is that at least a portion of the gas leaving the wafer/hybrid holding device is used to condition the atmosphere within the space. In the present invention, cooling air is therefore used simultaneously at least partially as dry air. It is advantageous if the portion of gas is firstly heat-treated and then allowed to flow out within the space.

For example, the portion is heat-treated outside a container and then fed back to the container. A particular advantage of this example is that a higher level of cooling efficiency is made possible by correspondingly feeding back the air from the sample stage to outside the container. In other words, the fed-back, cooled air can be additionally used either for pre-cooling the fed-in dried air or for cooling specific assemblies and not only for cooling the wafer/hybrid holding device.

However, it is alternatively or additionally possible for a portion of the gas to be allowed to flow out within the container directly after it leaves the sample stage. Since it is not expedient to allow it to flow out directly at all temperatures, a corresponding regulating valve is to be provided for this portion of gas.

Advantageous developments and improvements of the respective subject matter of the invention are given in the subclaims.

According to one preferred development, the line device has a first line via which the fluid can be conducted from outside the space into the wafer/hybrid holding device, a second line via which the fluid can be conducted from the wafer/hybrid holding device to outside the space, and a third line via which the fluid can be fed back from outside the space into the space. A temperature regulating device is provided between the second and third lines.

According to a further preferred development, outflow elements are provided at the end of the third line.

According to a further preferred development, the line device has a first line via which the fluid can be conducted from outside the space into the wafer/hybrid holding device, and a fourth line via which the fluid can be conducted from the wafer/hybrid holding device into the space.

According to a further preferred development, the line device has a second line via which the fluid can be conducted from the wafer/hybrid holding device to outside the space, and a third line via which the fluid can be fed back into the space from outside the space. A temperature regulating device is provided between the second and third lines.

According to a further preferred development, a valve is provided for regulating the flow rate of the fourth line.

According to a further preferred development, the temperature regulating device has a heating device.

According to a further preferred development, the temperature regulating device has a heat exchanger to which at least a portion of the fluid leaving the space can be conducted.

According to a further preferred development, the heat exchanger is used to precool the fed-in fluid.

According to a further preferred development, the line device is designed in such a way that the portion leaving the heat exchanger can be fed back at least partially into the space in order to condition the atmosphere.

According to a further preferred development, a further line is provided via which dry fluid can additionally be conducted directly into the space from outside the space.

According to a further preferred development, the space is essentially enclosed by a container.

Exemplary embodiments of the invention are illustrated in drawings and will be explained in more detail in the following description. In said drawings.

In the figures, identical reference symbols designate identical or functionally identical components.

Figure 5:
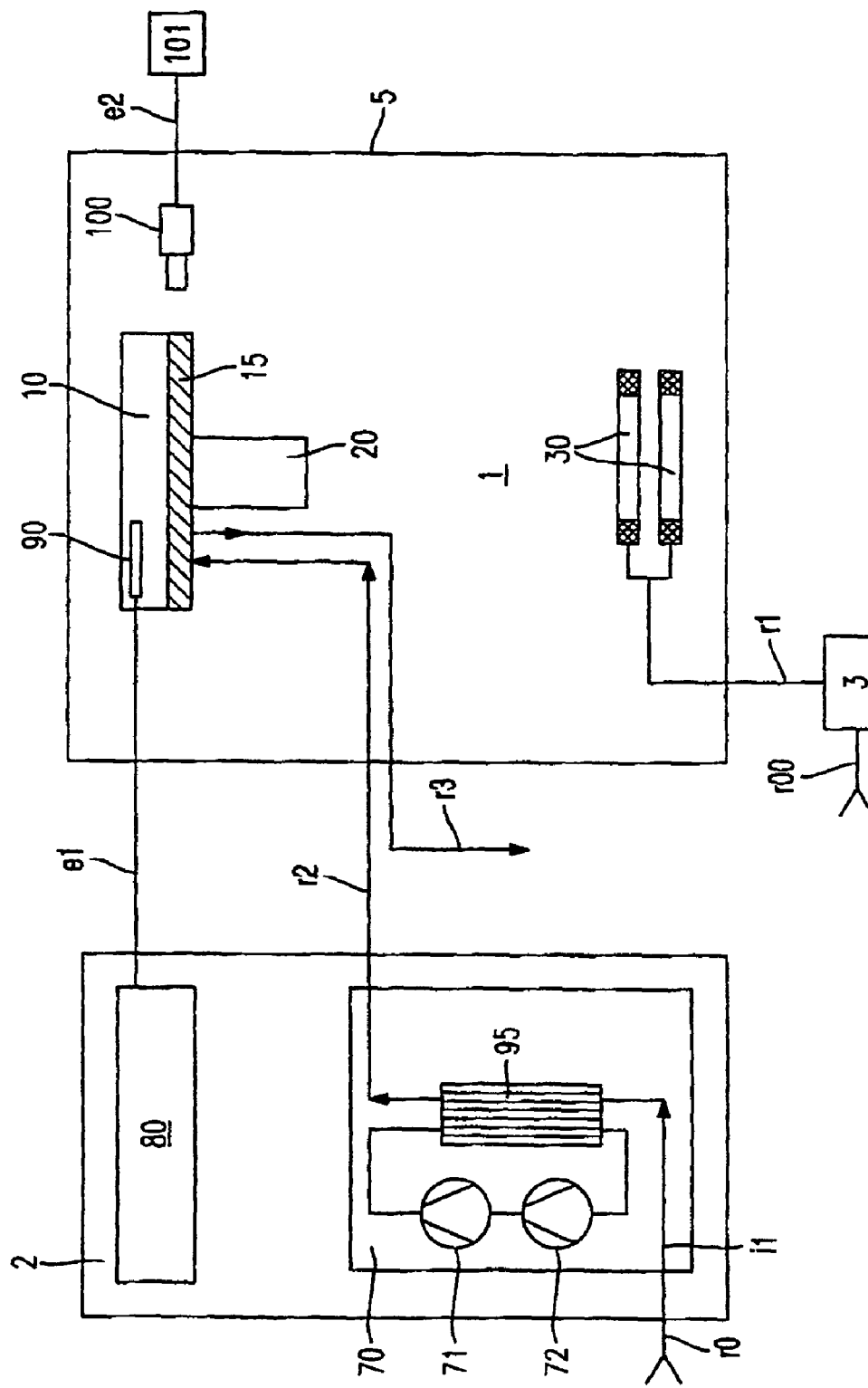
FIG. 5 is a schematic cross-sectional view of a conditioning device for the purpose of explaining the problems on which the present invention is based.

In what follows, components which have already been described above in conjunction with FIG. 5 will not be described again in order to avoid repetitions.

Reference symbol 80' designates a modified temperature controller which can not only regulate the temperature of the sample stage 10 by means of the heating device 90 but is also coupled to the dew point sensor 100 via a line 12 and can thus initiate automatic compensatory heating when there is a risk of condensation of water/icing.

Figure 1:
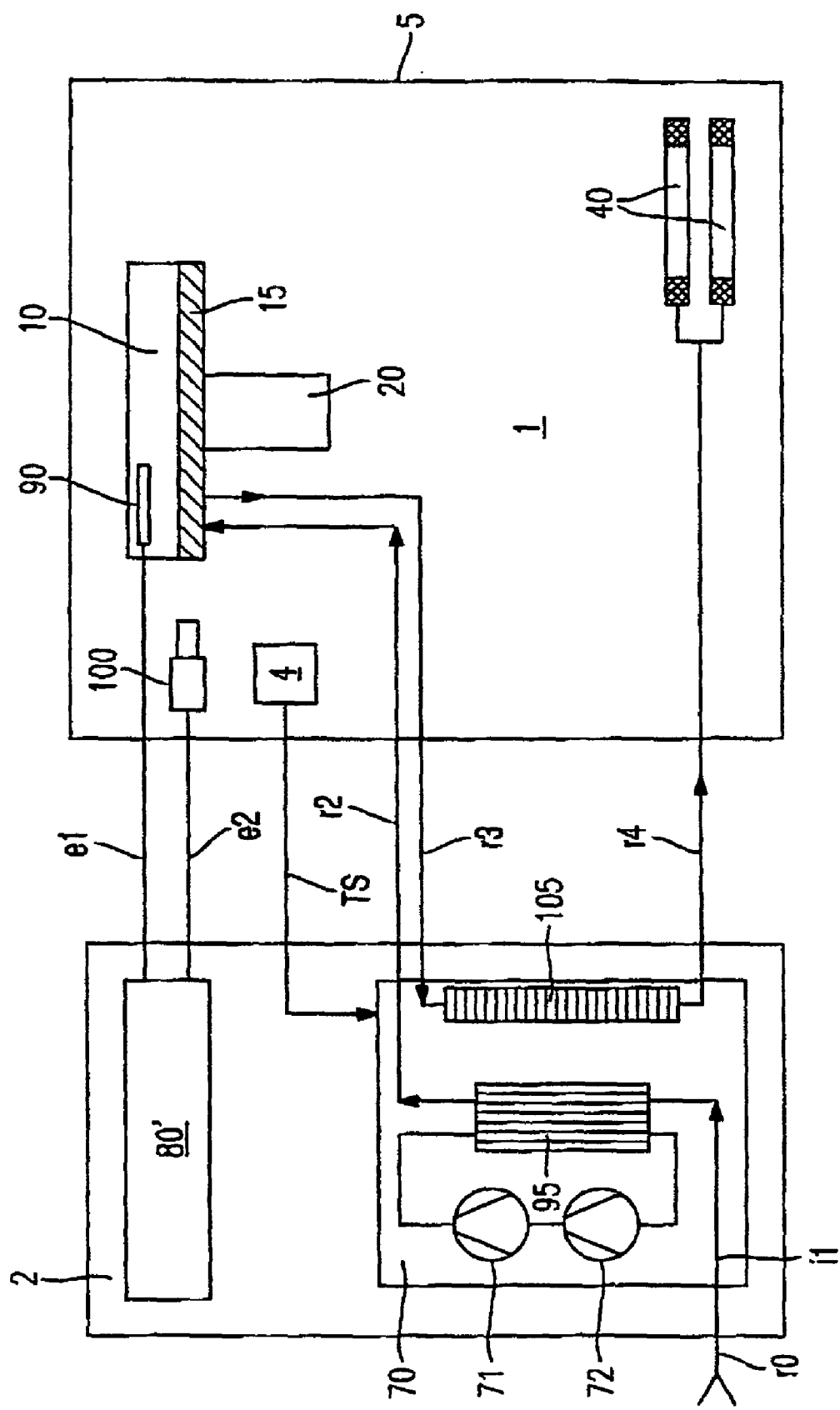
FIG. 1 is a schematic illustration of a first embodiment of the conditioning device according to the invention.

In the first embodiment according to FIG. 1, a heating device 105 is additionally integrated into the temperature regulating device 70 and is not in direct contact with the heat exchanger 95. Instead of ending at the ambient atmosphere, the line r3 is conducted to the heating device 105 so that the dry air which has left the sample stage 10 is, as it were, fed back to the temperature control rack 2 and after it has passed through the heating device 105 it is conducted back via the line r4 to the container 5 in which it flows out into the space 1 through outflow elements 40 for conditioning the atmosphere.

The reference symbol 4 designates a temperature sensor for sensing the temperature in the space 1, which sensor supplies a corresponding temperature signal TS to the temperature regulating device 70 which is used to regulate the temperature by means of the heating device 105.

By virtue of this arrangement, the dried air can fulfil a double function, specifically firstly cool the sample stage 10 and then condition the atmosphere of the space 1 before it is fed back to the ambient atmosphere through openings in the container 5, and is thus used more effectively.

Figure 2:
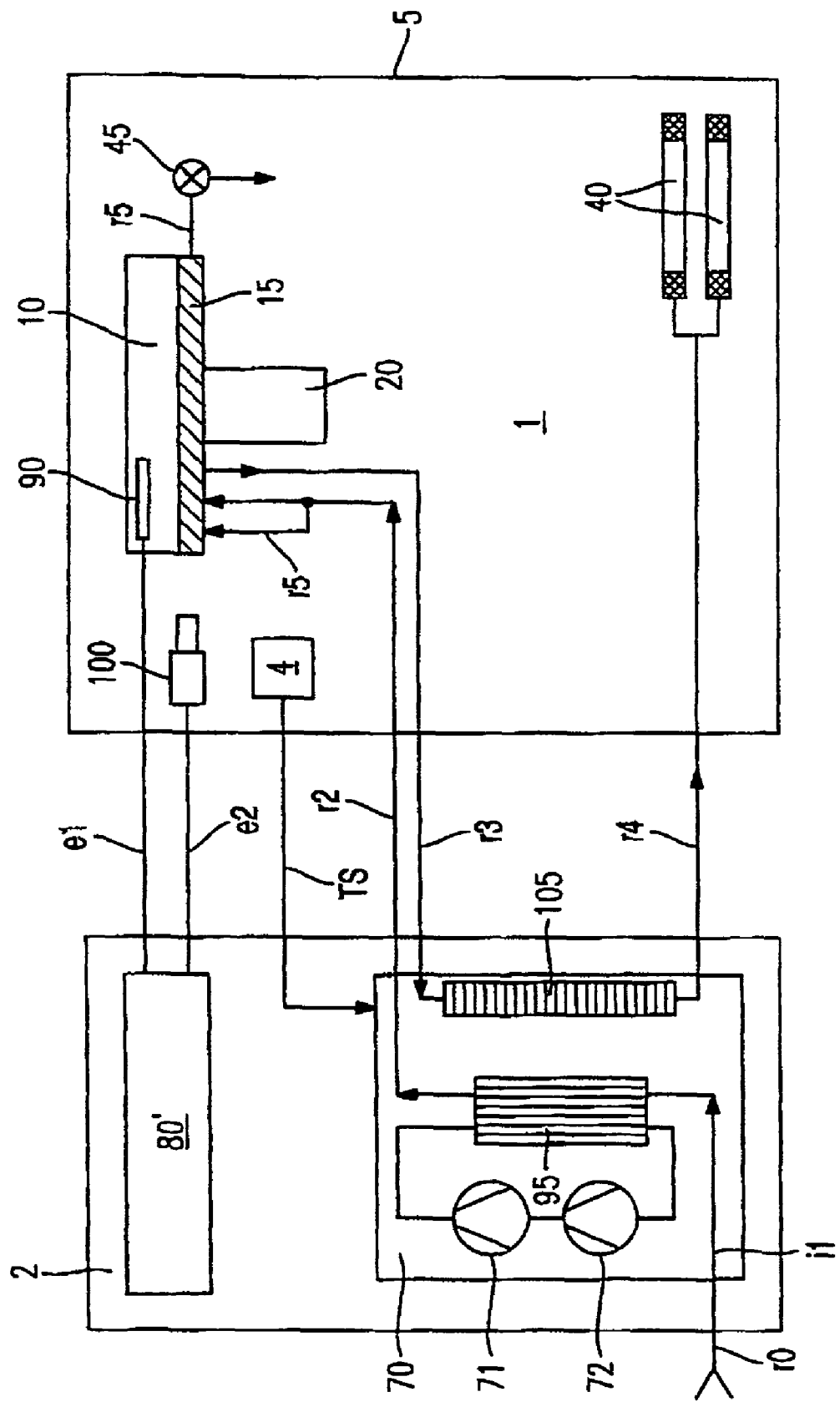
FIG. 2 is a schematic illustration of a second embodiment of the conditioning device according to the invention.

FIG. 2 is a schematic illustration of a second embodiment of the conditioning device according to the invention.

In the second embodiment according to FIG. 2, a line r5 branches off from the line r2 directly before the sample stage 10 and is also conducted through the sample stage 10 in the form of a cooling coil or a cooling pipe, but then leaves the sample stage 10 at a different point from that of the line r3 and from there via a controllable outlet valve 45 which conducts corresponding dried air directly into the container 5 after it leaves the sample stage 10.

Since this would lead to problems at very low temperatures in certain applications, this option of conducting the dry gas via the line r5 into the container 1 can be regulated by means of the outlet valve 45. The regulation can be carried out in a customary way, for example by remote control or in a wire-controlled fashion.

Otherwise the second embodiment is of identical design to the first embodiment described above.

Figure 3:
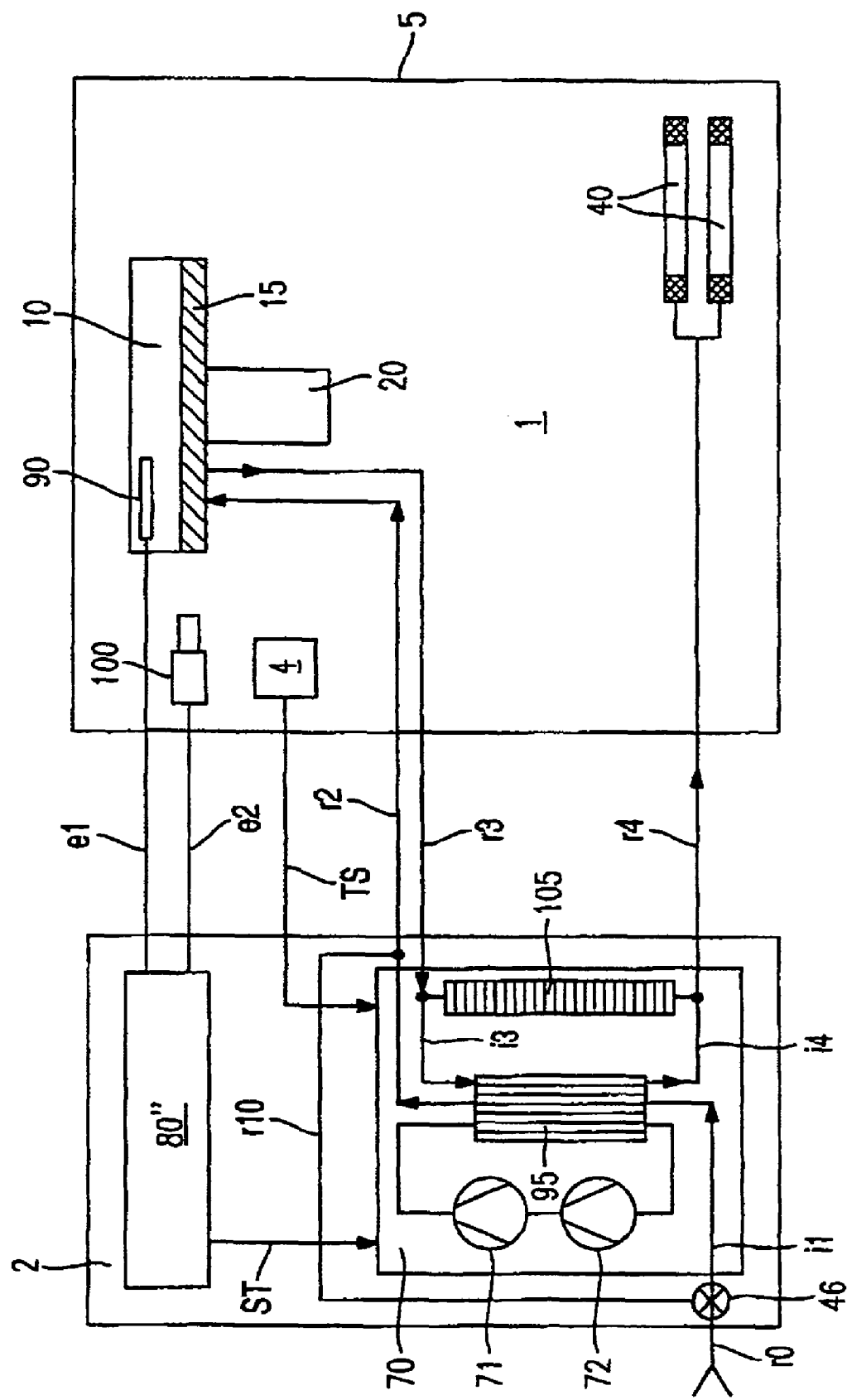
FIG. 3 is a schematic cross-sectional view of a third embodiment of the conditioning device according to the invention.

FIG. 3 shows a schematic cross-sectional view of a third embodiment of the conditioning device according to the invention.

Reference symbol 80' designates a further modified temperature controller which also controls the temperature regulating device 70 via the control line ST and thus plays the role of a central temperature control system.

In the third embodiment according to FIG. 3, a portion of the dry air which is fed back via the line r3 is branched off before the heating device 105 via line i3 and conducted through the heat exchanger 95 where it contributes to the cooling in the same way as the dry air which is freshly fed in via the lines r0, i1. The dry air leaves the heat exchanger 95 via the line i4, and directly after the heating device 105 it is combined with the air which has flowed through the heating device 105. From the corresponding junction point, this dried air is conducted, in precisely the same way as in the first embodiment, via the line r4 and the outflow elements 40 into the container 5 for conditioning its atmosphere.

Furthermore, this embodiment provides a controllable mixing valve 46 and a bypass line r10 by means of which the heat exchanger 95 can be bypassed.

The particular advantage of this embodiment is that a "residual coldness" of the dried air which flows back from the sample stage 10 can be used to cool the heat exchanger and at the same time can be fed back into the container 5 after heating.

Otherwise, the second embodiment is constructed in the same way as the first embodiment described above.

Figure 4:
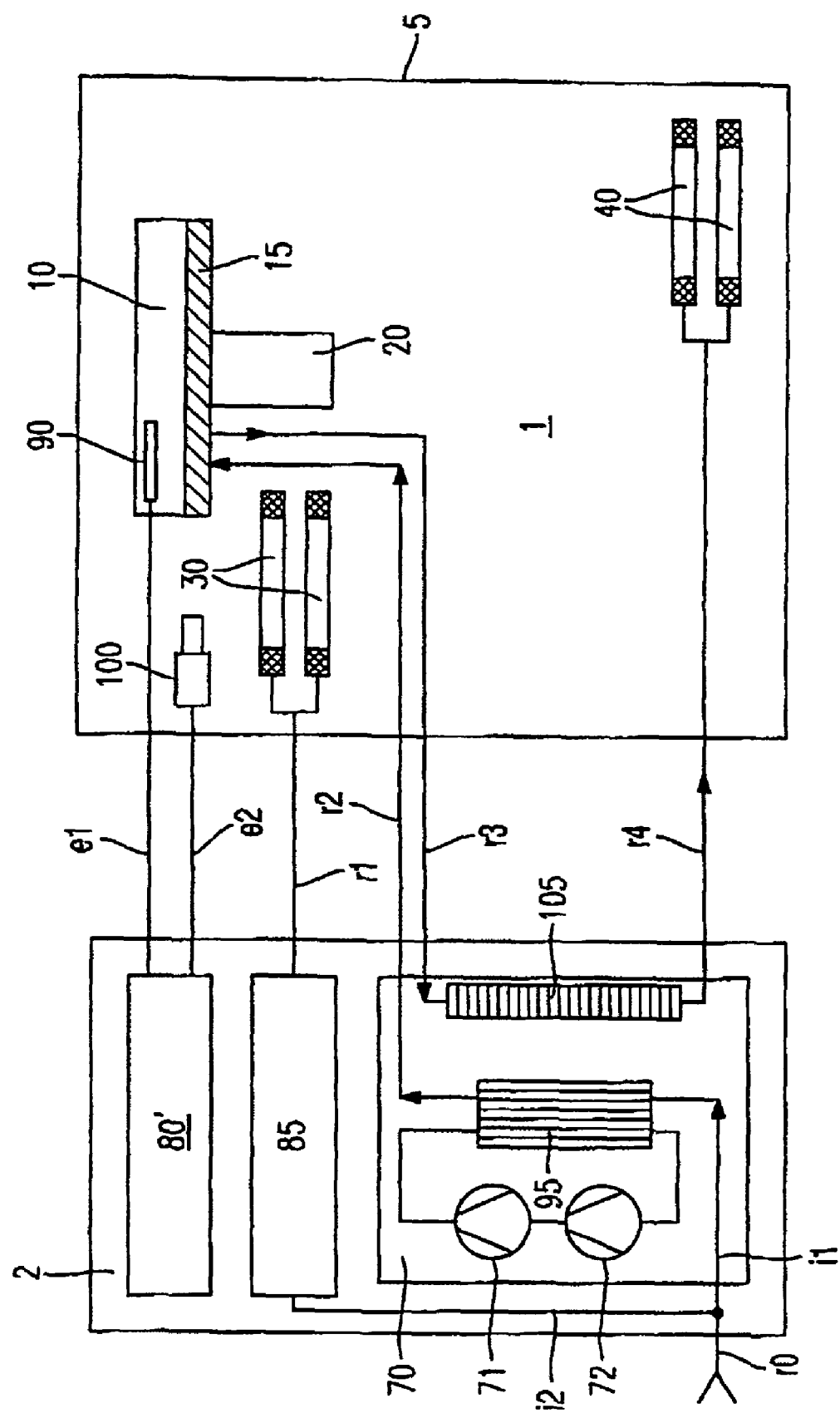
FIG. 4 is a schematic cross-sectional view of a fourth embodiment of the conditioning device according to the invention.

FIG. 4 is a schematic cross-sectional view of a fourth embodiment of the conditioning device according to the invention.

Reference symbol 85 in FIG. 4 designates an additional gas-temperature controller to which dry gas, for example dried air, is fed via lines r0, i2 from the same gas source as that of the heat exchanger 95, said air being placed at a predefined temperature by said controller and then conducted into the interior of the container 5 via the line r1 and via the outflow element 30.

The direct feeding in of dried air via the outflow element 30 in the container 5 is therefore additionally provided in this embodiment but it can also be configured in such a way that it can be switched off if the throughflow rate through the sample stage 10 is completely sufficient for conditioning the atmosphere within the container 5.

Although the present invention has been described above with reference to preferred exemplary embodiments, it is not restricted to them but rather can be modified in a variety of ways.

In particular it is to be noted that the exemplary embodiments above can of course be combined with one another. Additional line connections and regulating valves for the respective gas flow, which can be controlled manually or electrically, can also be provided.

In addition, the residual coldness of the fed-back gas can be used not only for cooling the heat exchanger 95 but also for cooling any desired other assemblies or heat exchangers before said residual coldness is fed back to the container 5.

The invention is also not restricted to gaseous dried air but can in principle be applied to any other fluids.

Furthermore, the wafer/hybrid holding device is not restricted to a sample stage or chuck but rather can be varied as desired, for example as a clamp device or the like.

The invention claimed is:

1. A method for conditioning semiconductor wafers and/or hybrids comprising:
    preparing a space which is essentially enclosed by a container and has a wafer/hybrid chuck which is located therein and has the purpose of holding a semiconductor wafer and/or hybrid applied to the wafer/hybrid chuck;
    pre-cooling a dry fluid in a single heat exchanger outside the space;
    conducting the pre-cooled fluid out of the single heat exchanger into the wafer/hybrid chuck via a first line, and then through the wafer/hybrid chuck to cool the wafer/hybrid chuck;
    conducting at least a portion of the fluid having been conducted through the wafer/hybrid chuck back to the single heat exchanger via a second line out of the wafer/hybrid chuck to the single heat exchanger; and
    heating the portion, by using a residual coldness of the portion to cool the single heat exchanger to contribute to the pre-cooling of the fluid in the single heat exchanger, wherein the heated portion is conducted via a third line from the single heat exchanger into the space, before being allowed to flow out within the space to condition the atmosphere in the space, and
    wherein the same single heat exchanger both:
        pre-cools and conducts the fluid to the wafer/hybrid chuck, and
        receives back the fluid from the wafer/hybrid chuck to contribute to the pre-cooling of the fluid.

2. The method according to claim 1, wherein the portion is firstly heat-treated and then allowed to flow out within the space.

3. The method according to claim 1, wherein the portion is heat-treated outside the space and then fed back to the space.

4. The method according to claim 1, wherein the portion is allowed to flow out within the space directly after it leaves the wafer/hybrid chuck.

5. A method for conditioning semiconductor wafers and/or hybrids, comprising:
    preparing a space which is essentially enclosed by a container and has a wafer/hybrid chuck which is located therein and has the purpose of holding a semiconductor wafer and/or hybrid applied to the wafer/hybrid chuck;
    pre-cooling a dry fluid in a single heat exchanger outside the space;
    conducting the pre-cooled fluid out of the single heat exchanger into the wafer/hybrid chuck via a first line, and then through the wafer/hybrid chuck to cool the wafer/hybrid chuck;
    wherein at least a portion of the fluid having been conducted through the wafer/hybrid chuck is used to condition the atmosphere within the space;
    wherein a first portion of the fluid having been conducted through the wafer/hybrid chuck is firstly conducted via a second line out of the wafer/hybrid chuck back to the single heat exchanger, then heated by using a residual coldness of the first portion to cool the single heat exchanger to contribute to the pre-cooling of the fluid in the single heat exchanger, and then conducted via a third line from the single heat exchanger into the space, before being allowed to flow out within the space,
    wherein a second portion having been conducted through the wafer/hybrid chuck is allowed to flow out within the space directly after it leaves the wafer/hybrid chuck, and
    wherein the same single heat exchanger both:
        pre-cools and conducts the fluid to the wafer/hybrid chuck, and
        receives back the fluid from the wafer/hybrid chuck to contribute to the pre-cooling of the fluid.

6. The method according to claim 5, wherein at least one of the first and second portions can be regulated in terms of flow rate.

7. The method according to claim 2, wherein the portion is heat-treated in that it is used for precooling the fluid, outside the space before said portion is allowed to flow out within the space.

8. The method according to claim 1, wherein the pre-cooled fluid, when conducted through the wafer/hybrid chuck in order to cool the wafer/hybrid chuck, crosses the wafer/hybrid chuck in a cooling coil or cooling pipe.

9. The method according to claim 5, wherein the pre-cooled fluid, when conducted through the wafer/hybrid chuck in order to cool the wafer/hybrid chuck, crosses the wafer/hybrid chuck in a cooling coil or cooling pipe.

* * * * *